US008035381B2

(12) United States Patent
Lustig et al.

(10) Patent No.: US 8,035,381 B2
(45) Date of Patent: Oct. 11, 2011

(54) OPTIMIZED SPECTRAL-SPATIAL PULSE

(75) Inventors: Michael Lustig, Palo Alto, CA (US); Charles H. Cunningham, San Francisco, CA (US); Albert P. Chen, San Francisco, CA (US); Daniel B. Vigneron, Corte Madera, CA (US); John M. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 281 days.

(21) Appl. No.: 12/259,990

(22) Filed: Oct. 28, 2008

(65) Prior Publication Data

US 2010/0102812 A1  Apr. 29, 2010

(51) Int. Cl.
*G01V 3/00* (2006.01)
(52) U.S. Cl. ....................................... 324/309
(58) Field of Classification Search .......... 324/300–322; 600/410–435
See application file for complete search history.

(56) References Cited

U.S. PATENT DOCUMENTS

| | | | | |
|---|---|---|---|---|
| 4,999,580 A | * | 3/1991 | Meyer et al. | 324/309 |
| 5,105,152 A | * | 4/1992 | Pauly | 324/309 |
| 5,189,371 A | * | 2/1993 | Conolly et al. | 324/309 |
| 5,233,301 A | * | 8/1993 | Meyer et al. | 324/309 |
| 5,786,692 A | * | 7/1998 | Maier et al. | 324/307 |
| 5,957,843 A | * | 9/1999 | Pak et al. | 600/410 |
| 6,750,651 B2 | * | 6/2004 | Overall | 324/309 |

OTHER PUBLICATIONS

Pauly et al., "Echo-Planar Spin-Echo and Inversion Pulses," Magn Reson Med., vol. 29, pp. 776-782, 1993.
Zur, "Design of Improved Spectral-Spatial Pulses for Routine Clinical Use," Magn Reson Med 43, pp. 410-420, 2000.
Ardenkjaer-Larson et al., "Increase in signal-to-noise ratio of >10,000 times in liquid-state NMR," Proc Natl Acad Sci USA, vol. 100, No. 18, pp. 10158-10163, 2003.
Cunningham et al, "Pulse sequence for dynamic volumetric imaging of hyperpolarized metabolic products," Journal of Magnetic Resonance, vol. 193, Issue 1, pp. 139-146, 2008.

* cited by examiner

*Primary Examiner* — Dixomara Vargas
(74) *Attorney, Agent, or Firm* — Beyer Law Group LLP (57) ABSTRACT

A computer implemented method for designing a spectral-spatial pulse for exciting at least one passband and minimally exciting at least one stopband is provided. A uniform shaped spectral envelope is generated. For a plurality of $k_z \neq 0$, $k_z$ dependent weights for a spectral envelope that approximate a $k_z=0$ envelope and provides the at least one passband and the at least one stopband for each of the plurality of $k_z \neq 0$ is generated.

19 Claims, 10 Drawing Sheets

OPTIMIZED SPECTRAL-SPATIAL PULSE

STATEMENT REGARDING FEDERALLY SPONSORED RESEARCH OR DEVELOPMENT

This invention was made with Government support under contract R01EB007588 awarded by the National Institutes of Health. The Government has certain rights in this invention.

BACKGROUND OF THE INVENTION

This invention relates generally to magnetic resonance imaging (MRI).

Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

SUMMARY

In accordance with the invention, a computer implemented method for designing a spectral-spatial pulse for exciting at least one passband and minimally exciting at least one stopband is provided. A uniform shaped spectral envelope is generated. For a plurality of $k_z \neq 0$, $k_z$ dependent weights for a spectral envelope that approximate a $k_z=0$ envelope and provides the at least one passband and the at least one stopband for each of the plurality of $k_z \neq 0$ is generated.

In another manifestation of the invention a magnetic resonance imaging (MRI) method for selectively imaging a first species and suppressing a second species is provided. A spectral-spatial excitation pulse is provided with a weighted $k_z$ dependent spectral envelope for selectively exciting the first species and suppressing the second species. A readout signal is acquired. An image is generated from the readout signal.

In another manifestation of the invention an apparatus for providing magnetic resonance imaging by selectively exciting a first species and suppressing a second species is provided. A magnetic resonance imaging excitation and detection system is provided. A controller is electrically connected to the magnetic resonance imaging excitation and detection system. The controller comprises a display, at least one processor, and computer readable media. The computer readable media comprises computer readable code for providing a spectral-spatial excitation pulse with a weighted $k_z$ dependent spectral envelope for selectively exciting the first species and suppressing the second species, computer readable code for acquiring a readout signal, computer readable code for generating an image from the readout signal, and computer readable code for displaying the image from the readout signal on the display.

The invention and objects and features thereof will be more readily apparent from the following detailed description and appended claims when taken with the drawings.

BRIEF DESCRIPTION OF THE DRAWINGS

FIGS. 1A and B illustrate a zig-zag k-space trajectory.

FIGS. 3A and B show suppression in the spectral stopband of the spectral-spatial pulse.

DETAILED DESCRIPTION OF ILLUSTRATIVE EMBODIMENTS

Dynamic nuclear polarization and dissolution of a $^{13}$C-labeled substrate enables the dynamic imaging of cellular metabolism. Spectroscopic information is typically acquired, making the acquisition of dynamic volumetric data a challenge. To enable rapid volumetric imaging, a spectral-spatial excitation pulse was designed to excite a single line of the carbon spectrum. With only a single resonance present in the signal, an echo-planar readout trajectory could be used to resolve spatial information, giving full volume coverage of 32×32×16 voxels every 3.5 seconds. This high frame rate was used to measure the different lactate dynamics in different tissues in a normal rat model and a mouse model of prostate cancer.

With the development of a method for retaining dynamic nuclear polarization (DNP) in solution, high SNR $^{13}$C MRI and MRSI data have been demonstrated in vivo following injection of a hyperpolarized $^{13}$C agent. This method enables not only the detection of the pre-polarized agent but also the rapid imaging of cellular metabolism. The large magnetization enhancement (~40,000 fold) resulting from DNP and the low temperature within the polarizer enables real-time imaging of metabolitic processes, with the downstream metabolic products differentiated from the injected compound based on a change in chemical shift. Detecting this change requires a frequency-sensitive imaging technique. In studies this has been accomplished with spectroscopic techniques in which the full spectrum is acquired, including the injected compound and downstream metabolic products.

Spectroscopic methods have the advantage that no assumptions need to be made about which specific frequency components will be observed. Also, the shape of each spectral line can be resolved, which is useful for understanding the chemical environment around the molecules of interest, and for obtaining information about spin coupling. However, spectroscopic methods typically require the acquisition of a long FID in order to achieve the desired spectral resolution. Thus they are relatively slow techniques with low SNR efficiency and coarse spatial resolution.

When there is one particular resonance of interest, such as $^{13}$C-lactate for metabolic imaging of cancer when hyperpolarized $^{13}$C-1-pyruvate is used as the injected substrate, then a different strategy can be used. In an embodiment of the invention, a spectral-spatial excitation pulse was designed to excite a single line of the carbon spectrum. Since only a single resonance is present in the signal, an echo-planar readout trajectory could be used to resolve the spatial information, giving full volume coverage every 3.5 seconds. Results from phantoms, a normal rat model and a mouse model of prostate cancer are shown to demonstrate the feasibility and performance of this embodiment of the invention.

Theory

Spectral-spatial radiofrequency (RF) pulses are selective in both frequency and space. This dual selectivity is accomplished by using an oscillating magnetic field gradient, with a shaped RF sub-pulse transmitted during each half-cycle of the gradient. As an approximation, the spatial profile is determined by the shape of each sub-pulse, and the spectral profile determined by the envelope of the train of sub-pulses. Since the envelope is discretized (by the sub-pulses), periodic replicas of the main spectral profile appear in frequency space.

For exciting a single resonance of the $^{13}$C spectrum, the challenge is achieving a stopband of adequate width and attenuation between the central passband of the pulse and these distorted replicas in frequency space. The replicas are distorted because the trajectory through excitation k-space is a "zig-zag" pattern. In addition to the imperfect replicas, the zig-zag trajectory also results in bipolar "ghosts" spaced every $1/(2\tau)$ from the main passband, where $\tau$ is the period of the gradient waveform. These bipolar lobes are the result of imperfect cancellation between replicas from the positive and negative parts of the gradient waveform.

To widen the stopband, the gradient oscillation frequency can be increased, which comes at the expense of a larger minimum slab width due to the decreased area under each gradient lobe. Also, one of the bipolar ghosts can be suppressed by using oscillating polarity in the RF sub-lobes, as introduced in J. M. Pauly, D. Spielman, A. Macovski, "Echo-planar spin-echo and inversion pulses," *Magn Reson Med* 29, 776-782 (1993) and further explained in Zur, "Design of improved spectral-spatial pulses for routine clinical use,"* *Magn Reson Med* 43, 410-420 (2000), where both references are incorporated by reference for all purposes. However, for the high degree of attenuation needed to suppress the signal from the injected hyperpolarized compound, enabling imaging of a single metabolic product, a more advanced strategy that takes into account the zig-zag trajectory through excitation k-space must be used.

Figure 1:
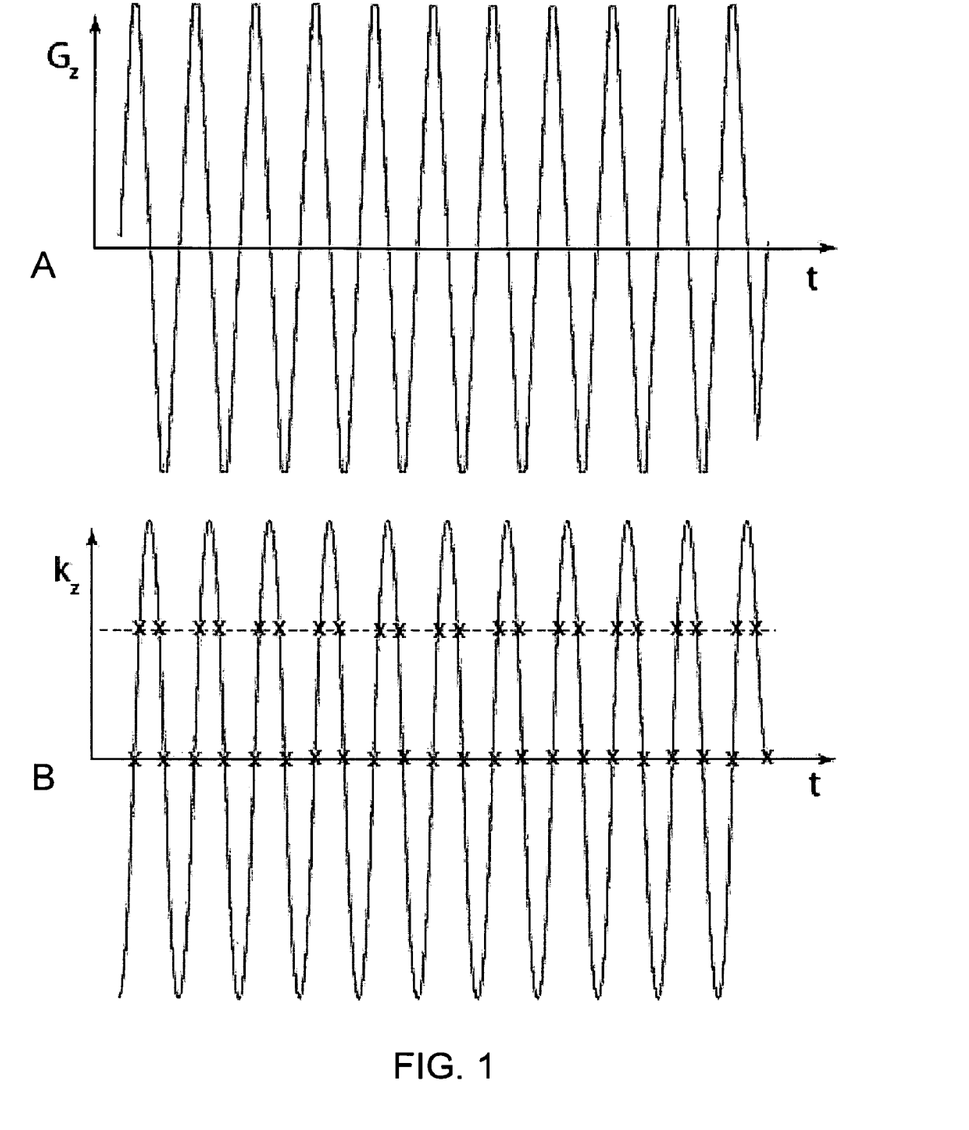

The zig-zag k-space trajectory through excitation k-space used with a typical spectral-spatial pulse is shown in FIG. 1A. FIG. 1B illustrates that the integral of the gradient shape gives the trajectory through excitation k-space. The "x" marks in FIG. 1B indicate that the temporal sample points are evenly distributed along the central (DC) line of the spatial k-space pattern, but are "staggered" away from the center. This staggered sampling pattern is the reason for the ghosts at $1/(2\tau)$ from the main passband. The ghosts get worse further from the center of the frequency axis because the artifact caused by staggered sampling is worse for higher frequency signals. Compensating for this staggered sampling is key to the design technique used in this embodiment of the invention. The reason that the technique described in the previous paragraph works is that staggered sampling has no effect on constant-amplitude (DC) signals, so an adequate suppression can be achieved around 0 Hz despite the zig-zag pattern.

To further improve the attenuation in the stopband, the weighting function in excitation k-space can be designed for the specific zig-zag pattern traced out by the oscillating gradient waveform. This weighting function, defined as the $B_1(t)/\gamma G(t)$, is commonly used in the literature on multidimensional RF pulses and should not be confused with the weighting matrix W used in this embodiment of the invention. In conventional spectral-spatial RF pulse designs, the two-dimensional weighting function in excitation k-space is the outer product of the Fourier transforms of the desired spectral and spatial profiles. Thus, the shape of the weighting function along any line across the time dimension (i.e. the "x" marks in FIG. 1B is the same. However, in this work, a different weighting function was used for each $k_z$ position to compensate for the difference in sample spacing illustrated in FIG. 1B.

To solve for r, a vector containing the energy deposited by the RF pulse at each point along one of the non-uniformly sampled lines, we begin with discrete Fourier transform in matrix notation:

$$S = Fs \quad (1)$$

where S and s are column vectors and F is a Fourier matrix with the elements:

$$F_{jk} = \exp(i2\pi(j-1-N/2)(k-1)/N) \quad (2)$$

where N is the number of points in s. To account for the staggered sampling along each of the off-centre lines in FIG. 1B, a Fourier matrix modified to include the sample delays along the particular line, $-1 \leq \Delta_k \leq 1$, is used:

$$A_{jk} = \exp(i2\pi(j-1-N/2)(k-1+\Delta_k)/N). \quad (3)$$

For example, the $\Delta_k$ values along the upper, staggered samples in FIG. 1B might be [+0.25, −0.25, +0.25, −0.25 . . . ]. A standard weighted least squares formulation can then be applied to solve for the non-uniformly spaced r values with a Fourier transform that most closely matches the desired frequency response H:

$$r = (A^\dagger WA)^{-1} A^\dagger WH. \quad (4)$$

W is a diagonal matrix of weights that specifies the important part of the spectrum to fit to. In this embodiment, W was 1 for the central half of the matrix covering the stopband, and 0.01 elsewhere. H is a column vector containing the desired frequency response.

With only a single line of the spectrum excited using a spectral-spatial RF pulse, efficient imaging techniques with readout trajectories such as echo-planar methods can be used. This is the strategy taken in the experiments of the embodiments described below.

Methods and Results

Figure 2:
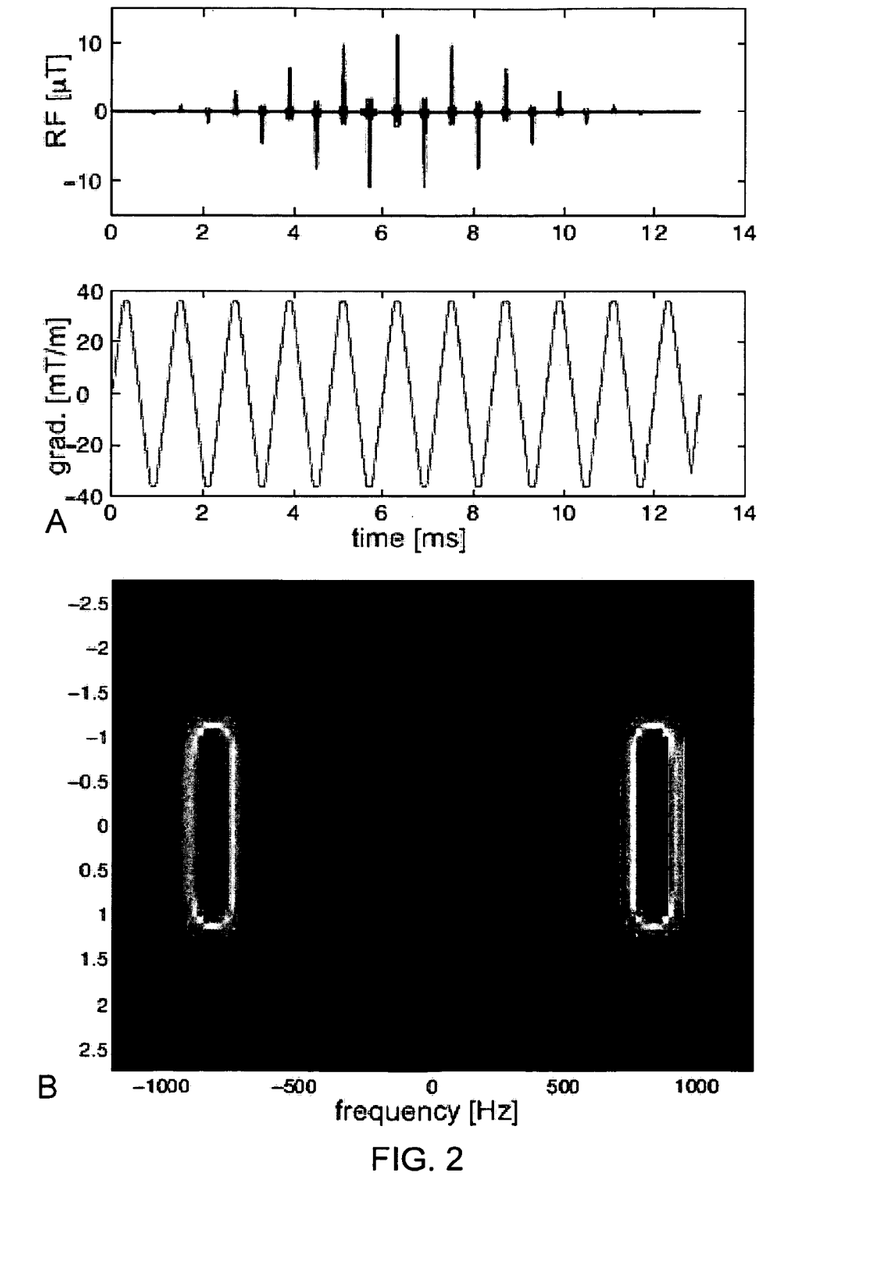
FIG. 2A shows both an RF pulse and the gradient waveform, which consists of 21 sub-lobes.
FIG. 2B shows the large spectral stopband and the sharp special selectivity of the pulse.

A spectral-spatial RF pulse was designed for exciting a single component of the spectrum (in this case $^{13}$C-1-lactate). The RF pulse (shown in FIG. 2A, which shows both the RF pulse and the gradient waveform) consisted of 21 sub-lobes, each with 600 μs duration. The desired frequency response function, H in Eq. 4, consisted of a passband with time-bandwidth product of 3, 1% in-band ripples and 0.1% out-of-band ripples. The response in the spatial dimension consisted of a passband with time-bandwidth product and ripples of 0.1% both inside and outside. FIG. 2B shows the large spectral stopband and the sharp special selectivity of the pulse.

Figure 3:
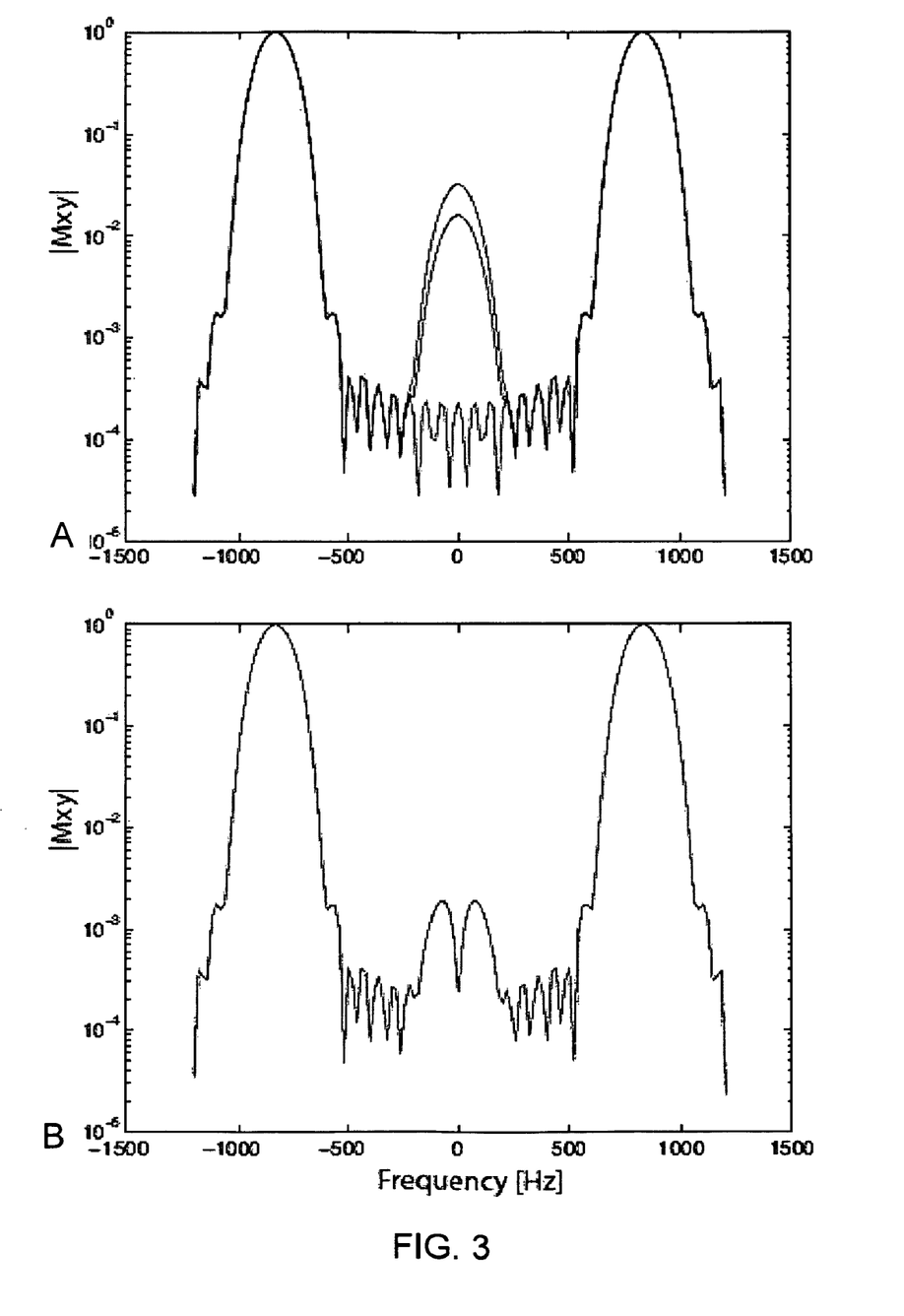

FIGS. 3A and B show suppression in the spectral stopband of the spectral-spatial pulse. Plots of the spectral profile at the center of the slice as well as two intermediate positions within the slice are shown overlapping. In FIG. 3A, the spectral profile of the pulse shows inadequate suppression in the stopband, seen as the lobes at 0 Hz. As seen in FIG. 3A, the RF pulse gives a 180 Hz passband (full-width at-half-max) and a 440 Hz stopband (60 dB attenuation). FIG. 3B illustrates that using an embodiment of the invention, compensates for the zig-zag trajectory through excitation k-space. This lobe is suppressed giving 60 dB attenuation. Using the filter-design method in this embodiment of the invention, resulted in a 26-fold improvement in the stopband suppression that can be seen by comparing FIG. 3A with FIG. 3B. The stopband suppression did not vary significantly over the tip angle range from 0 to 90 degrees. The level of attenuation is achieved at all locations within the slice, as seen by the identical overlapping plots.

Figure 4:
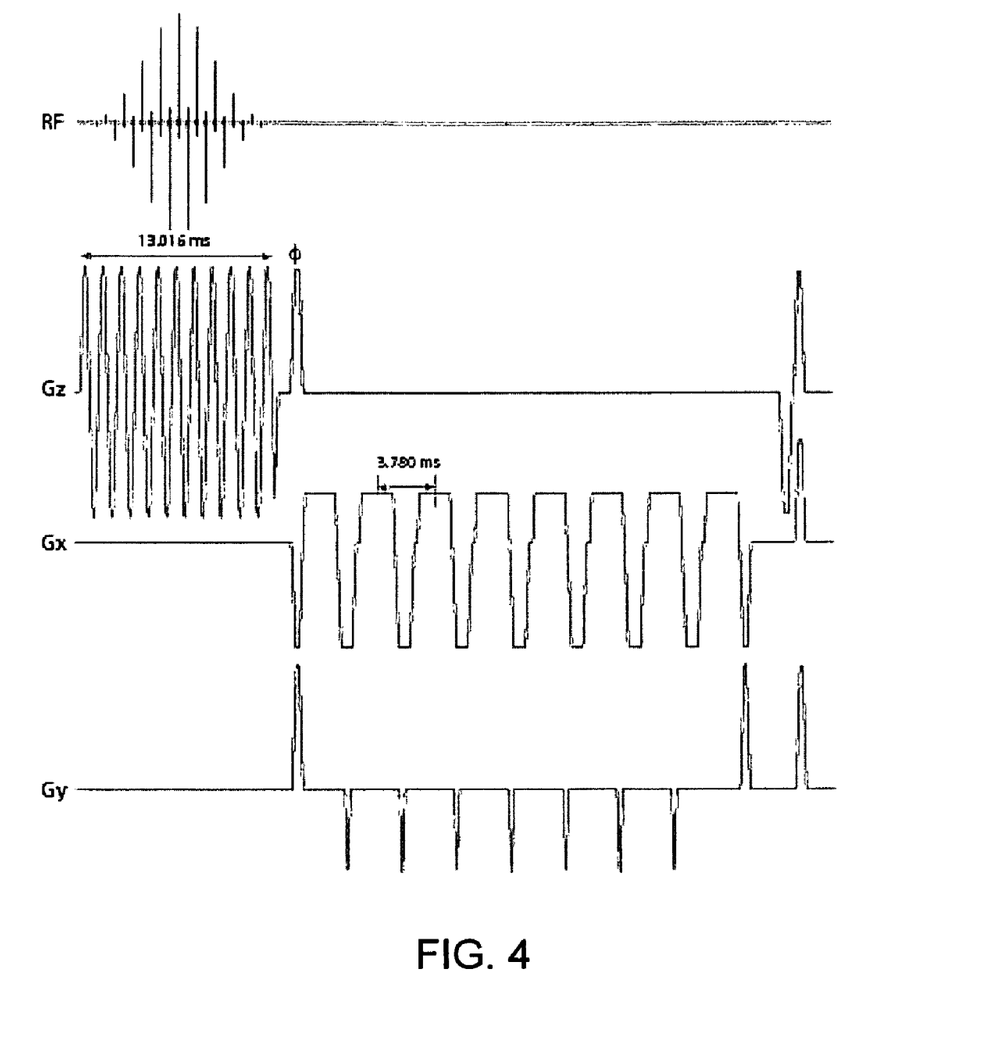
FIG. 4 shows a RF pulse implemented in a rapid, "flyback" echo-planar imaging pulse sequence.

The RF pulse was implemented in the rapid, "flyback" echo-planar imaging pulse sequence shown in FIG. 4. The sequence is designed to resolve a volume of 32×32×16 voxels every 3.5 seconds, and can be run continuously to acquire time-resolved data. The maximum spatial resolution is 2.5 mm in-plane and 2 mm through slice. With eight phase-encode lines acquired per excitation, 64 excitations are required to resolve the volume. Progressively larger delays were used for successive echo-planar interleaves to smooth any off-resonance phase accrual across k-space. The center of k-space is crossed on the 5th lobe of the readout gradient, giving an effective TE of 22.5 ms (measured from the center of the RF pulse). The sequence consists of a 13.016 ms spectral-spatial RF excitation pulse followed by a gradient lobe to the phase-encode through-slice direction (labeled $\phi$). The four lobes of the echo-planar readout gradient on $G_x$ are separated by 3.780 ms, with blips on $G_y$ in between.

For the experiments for this embodiment, the dynamic nuclear polarization (DNP) and dissolution method as described in, J. H. Ardenkjaer-Larson, B. Fridlund, A. Gram, G. Hansson, L. Hansson, M. H. Lerche, R. Servin, M. Thaning, K. Golman, "Increase in signal-to-noise ration of >10,000 times in liquid-state NMR," *Proc Natl Acad Sci USA* 100, 10158-10163 (2003), which is incorporated by reference for all purposes, was used to achieve ~15% polarization for $^{13}$C-1-pyruvate in the solution state. The sample was rapidly dissolved to a concentration of 79 mM. Polarization was estimated by extracting a small aliquot of the dissolved solution and injecting it into a capillary tube within a custom-designed polarimeter. At the same time as the polarization measurement, the polarized sample was rapidly carried to a General Electric EXCITE 3 T (Waukesha, Wis.) clinical MRI system equipped with 40 mT/m, 150 mT/m/ms gradients and a broadband amplifier.

Phantom and in vivo experiments were performed to test the method. All animal experiments were carried out under a protocol approved by the institutional animal care and use committee. For phantom and rat experiments, a custom designed dual-tuned rat birdcage coil (inner diameter 8 cm) was used for signal transmission and reception, allowing push-button switching between proton and carbon imaging. To test the image quality achievable with the new pulse sequence, a small cylindrical phantom (4.4 cm diameter) was imaged, and compared with a conventional 2D spectroscopic scan with phase encoding applied along both in-plane directions. For all experiments, the nominal flip angle was 5°.

Figure 5A:
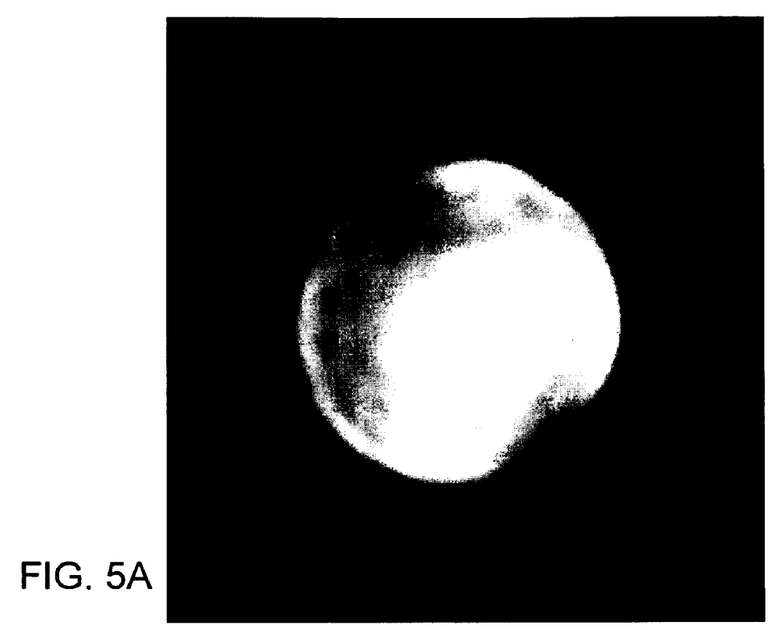
FIGS. 5A and B show results of a phantom experiment.
Figure 5B:
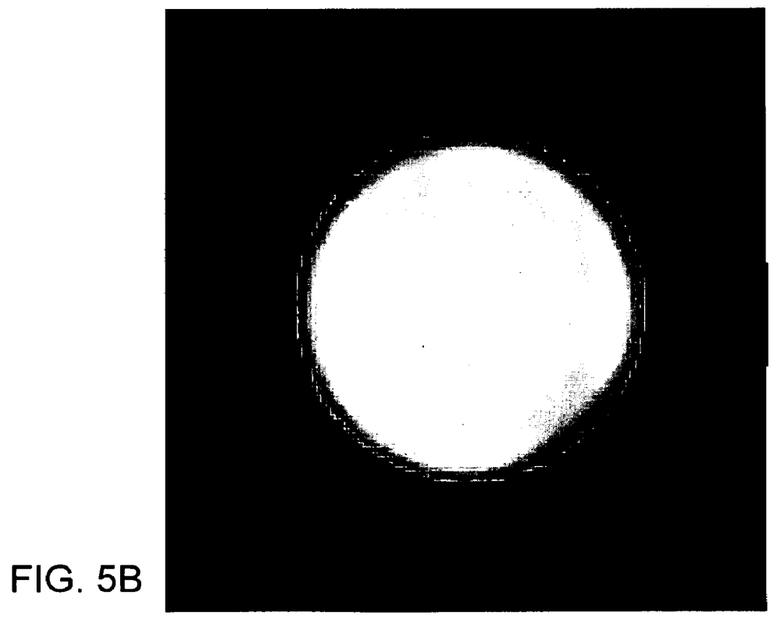

FIGS. 5A and B show results of a phantom experiment, where FIG. 5A shows the result of an embodiment of the invention using a TR=55 ms, TE=22.5 ms, scan time 3.5 s, for a volume of 32×32×16 voxels and where FIG. 5B shows the result of a conventional chemical shift imaging (CSI) sequence with phase encoding in both in-plane direction and TR=600 ms, TE=1 ms, scan time=614 s, for a volume of 32×32×1 voxels. For both scans, the field of view (FOV) was 8 cm with the same slice position.

Figure 6A:
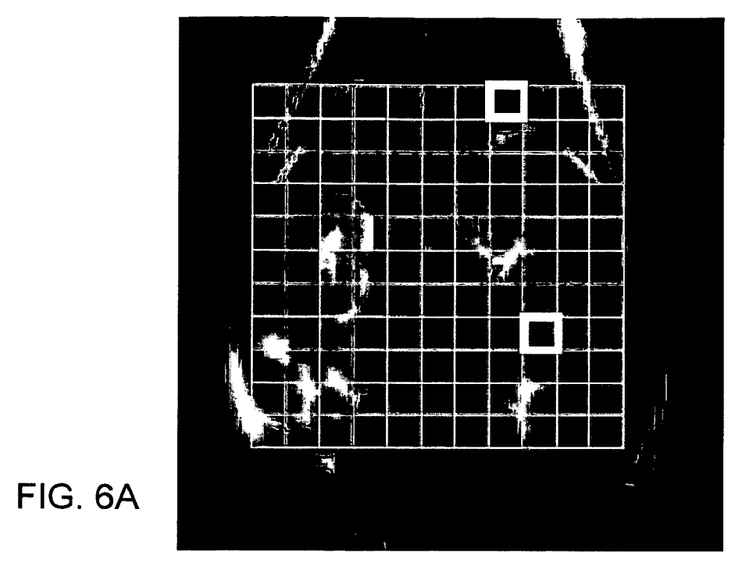
FIGS. 6A-C show the results of an experiment showing different signal dynamics in different tissues.
Figure 6B:
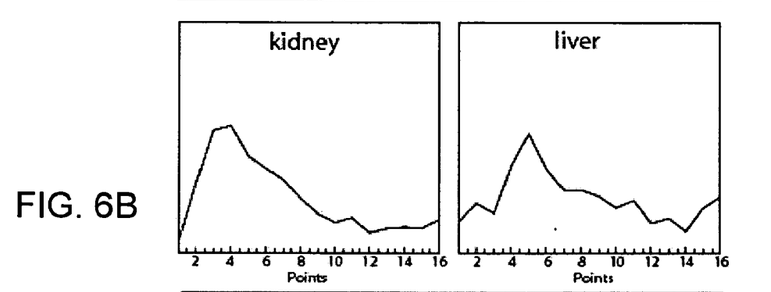
Figure 6C:
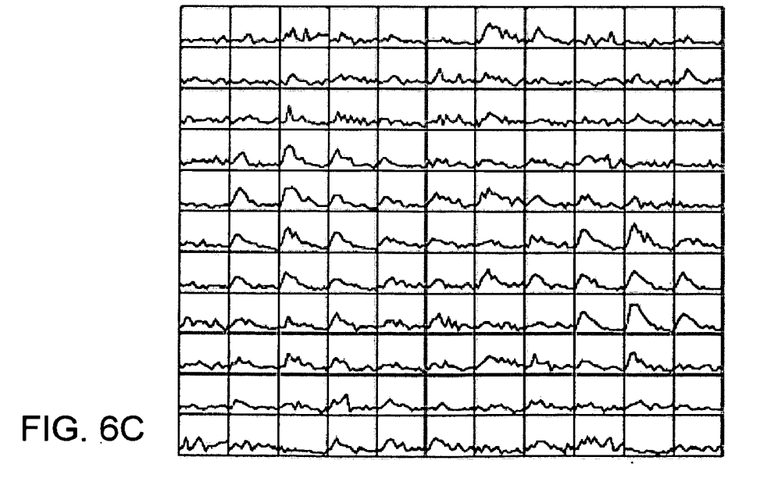

An injection of 3.0 mL of the hyperpolarized solution into the tail vein of a 350 g Sprague-Dawley rat was made at the same time as the start of the data acquisition. The injection was made slowly over a period of 12 s to accommodate the relatively large volume of injected fluid. The pulse sequence was run continuously, with a 3-dimensional $^{13}$C data set acquired every 5 seconds and a total imaging time of 1 minute 20 seconds for sixteen data sets. The center frequency of the passband was set on the expected frequency of lactate, based on previous in vivo $^{13}$C studies. FIGS. 6A-C show the results of this experiment showing different signal dynamics in different tissues. FIG. 6A shows a grid arrangement of the 5×5×5 mm voxels overlaid on the anatomical (proton) image. FIG. 6B shows a lactate signal at each 5 s time-point for kidney and liver tissue. The time courses are from the upper and lower voxels highlighted in FIG. 6A, respectively. FIG. 6C shows the lactate time-courses from all the voxels in the grid, which shows different lactate metabolism in different tissues, where each grid element shows the lactate signal as a function of time.

Figure 7A:
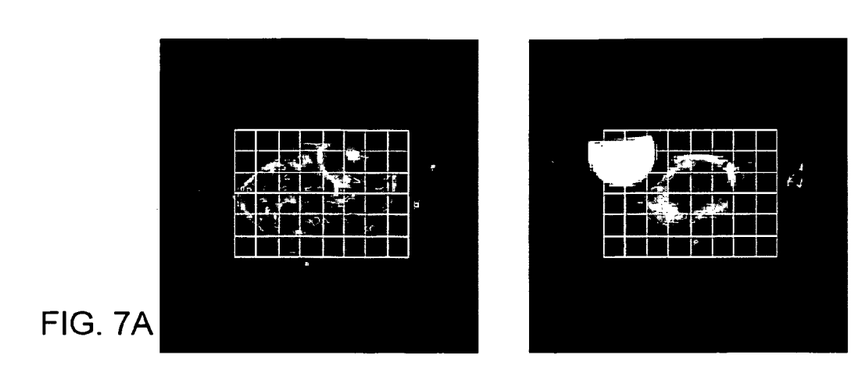
FIGS. 7A-C show the results of an experiment.
Figure 7B:
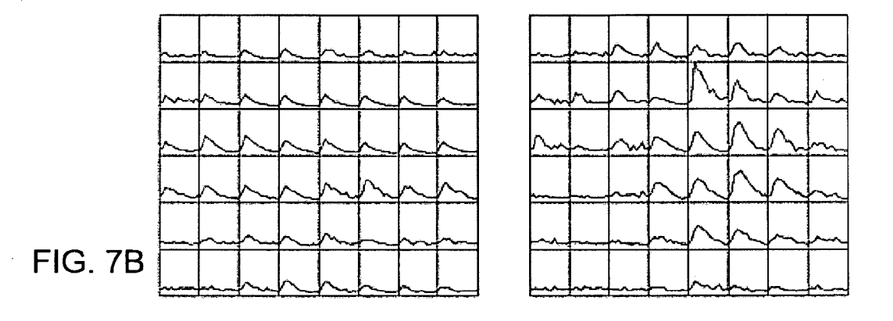
Figure 7C:
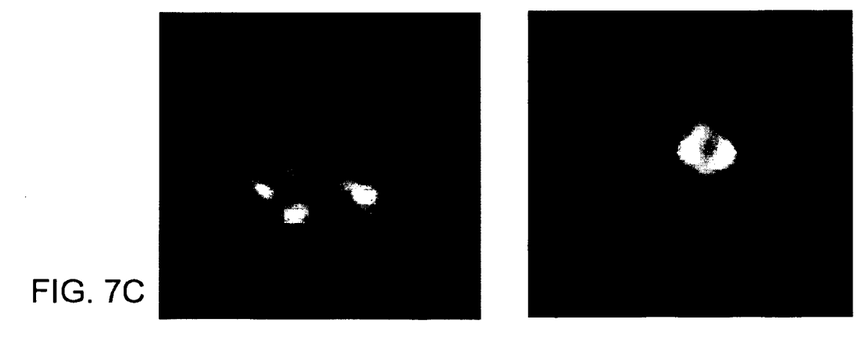

In a separate in vivo experiment, the production of lactate was studied in a Transgenic Adenocarcinoma of Mouse Prostate (TRAMP) mouse model. A custom-designed dual-tuned mouse birdcage coil (5 cm inner diameter and 8 cm length) was used for RF transmission and reception. Intravenous access was established by a semi-permanent jugular vein catheter placed in a surgical operation one day before the MR exam. An injection of 0.3 mL of the hyperpolarized solution was made through the catheter at the same time as the start of the scan. The injection was made over a period of 12 s. The pulse sequence was run as described above. The results of this experiment, shown in FIGS. 7A-C, suggest that significantly different dynamic curves are observed in tumor vs. non-cancerous tissue. FIG. 7A shows the voxel (3×3×4 mm) locations of the $^{13}$C data overlaid on an axial proton image through two slices through the abdomen of the mouse (left) and through the tumor (right). FIG. 7B shows the time-course of the $^{13}$C lactate produced in each voxel (each grid element shows the lactate signal as a function of time). FIG. 7C shows a lactate image taken at a 5$^{th}$ timepoint. The syringe seen to the left of the tumor contained a $^{13}$C lactate reference, but became saturated after a few time points. The signal seen outside the abdomen is likely a combination of noise, Gibbs ringing, and artifact due to lactate signal changing during the volume acquisition.

DISCUSSION AND CONCLUSIONS

This embodiment of the invention provides and demonstrated a pulse sequence for rapid imaging of a single metabolic product resulting from injection of a hyperpolarized $^{13}$C-labeled substrate. By employing a spectral-spatial excitation pulse, only the resonance of interest is excited. The fact that the excited spectrum consists of only a single line enables the use of efficient readout trajectories such as the echo-planar readout used in this study. Another benefit of the spectrally-selective excitation pulse is that the substrate itself is not excited. This presumably prolongs the signal from downstream metabolites such as lactate because this magnetization is replenished as the un-excited pyruvate is metabolized, although this was not tested.

With the high temporal resolution afforded by exciting only a single resonance, the dynamic detection curves shown in FIGS. 6A-C and FIGS. 7A-C can be measured. It is interesting to note that the curves have different shapes in different tissues, which is seen by comparing kidney and liver in FIGS. 6A-C. The tumor in FIG. 7D also demonstrates a dynamic curve distinctly different from surrounding tissue. The main differences between these curves are the time to maximum signal, and the peak level of lactate (which is notably high in the tumor). However, it is not possible to determine whether these differences in lactate dynamics are due exclusively to different lactate production rates in the particular tissue, or due to differences in perfusion and/or wash-in of lactate produced at another site. To address this uncertainty, it may be useful to include a periodic excitation of the pyruvate resonance, interleaved with the lactate measurement, to give a measurement of metabolite in-flow. However, this would come at the expense of reduced temporal resolution.

The passband of the spectral profile of the spectral-spatial RF pulse was designed to be narrow and Gaussian-like. This is a potential source of signal variation since the resonance frequency varies spatially near susceptibility boundaries and temporally with respiration. However, the low time-bandwidth product (3.0) of the spectral passband, which leads to its Gaussian shape, was necessary in order to achieve adequate suppression of alanine, which the nearest large peak in the carbon spectrum at 195 Hz from lactate. A flatter spectral passband could be achieved with a longer RF pulse, but this would come at the expense of temporal resolution. The other effect of the narrow spectral passband is that the frequencies contributing to the image are restricted, so that the distortions and artifacts associated with a long echo-planar readout are mitigated.

In conclusion, an embodiment of the invention provides an echo-planar pulse sequence for rapid imaging of hyperpolarized metabolic products. By using a spectral-spatial excitation, only the resonance of interest is excited, alleviating the need for a spectroscopic acquisition and enabling volumetric coverage in 3.5 s. This high frame rate was used to measure the different lactate dynamics in different tissues in a normal rat model and a mouse model of prostate cancer.

Pulse Design

An embodiment of the invention provides a spectral-spatial pulse design that provides improved passband and stopband filtering, by providing a weighted $k_z$ dependent spectral envelope.

Figure 8:
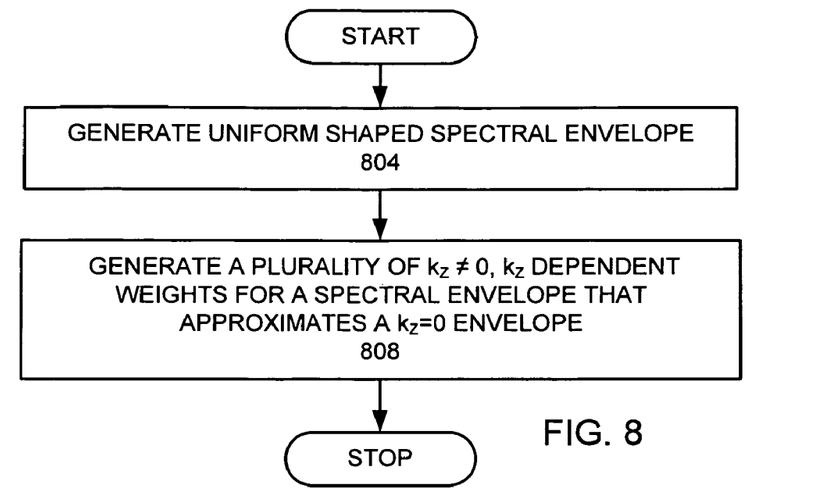
FIG. 8 is a high level flow chart of an embodiment of the invention for providing a weighted $k_z$ dependent spectral envelope.

FIG. 8 is a high level flow chart of an embodiment of the invention for providing a weighted $k_z$ dependent spectral envelope. A uniform shaped spectral envelope is generated (step 804). A plurality of $k_z \neq 0$, $k_z$ dependent weights for a spectral envelope that approximates a $k_z = 0$ envelope and provides at least one passband and at least one stopband for each of the plurality of $k_z \neq 0$ are generated (step 808). The generation of the $k_z$ dependent weights uses equation 2.

It has been found that such weights provide skew correction. In an embodiment of the invention the stopband and passband provide selective excitation of a first species, such as water, while suppressing a second species, such as fat.

General Overview of an Embodiment

Figure 9:
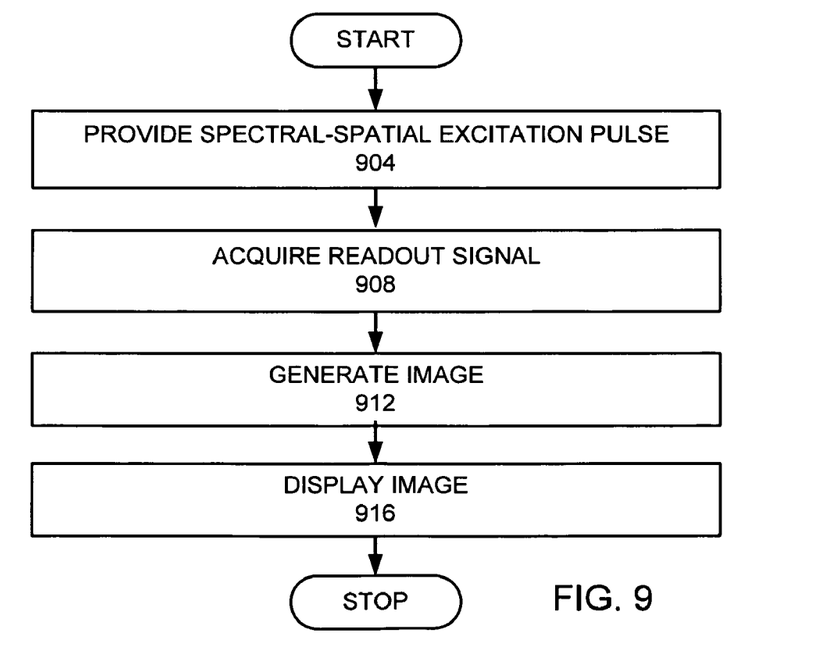
FIG. 9 is a high level flow chart of an embodiment of the invention for selectively magnetic resonance imaging a first species and suppressing a second species.

FIG. 9 is a high level flow chart of an embodiment of the invention for selectively magnetic resonance imaging a first species and suppressing a second species. A spectral-spatial excitation pulse with a $k_z$ dependent spectral envelope for selectively exciting the first species and suppressing the second species is provided (step 904). A readout signal is acquired (step 908). An image is generated from the readout signal (step 912). The image is displayed on a display (step 916).

Figure 10:
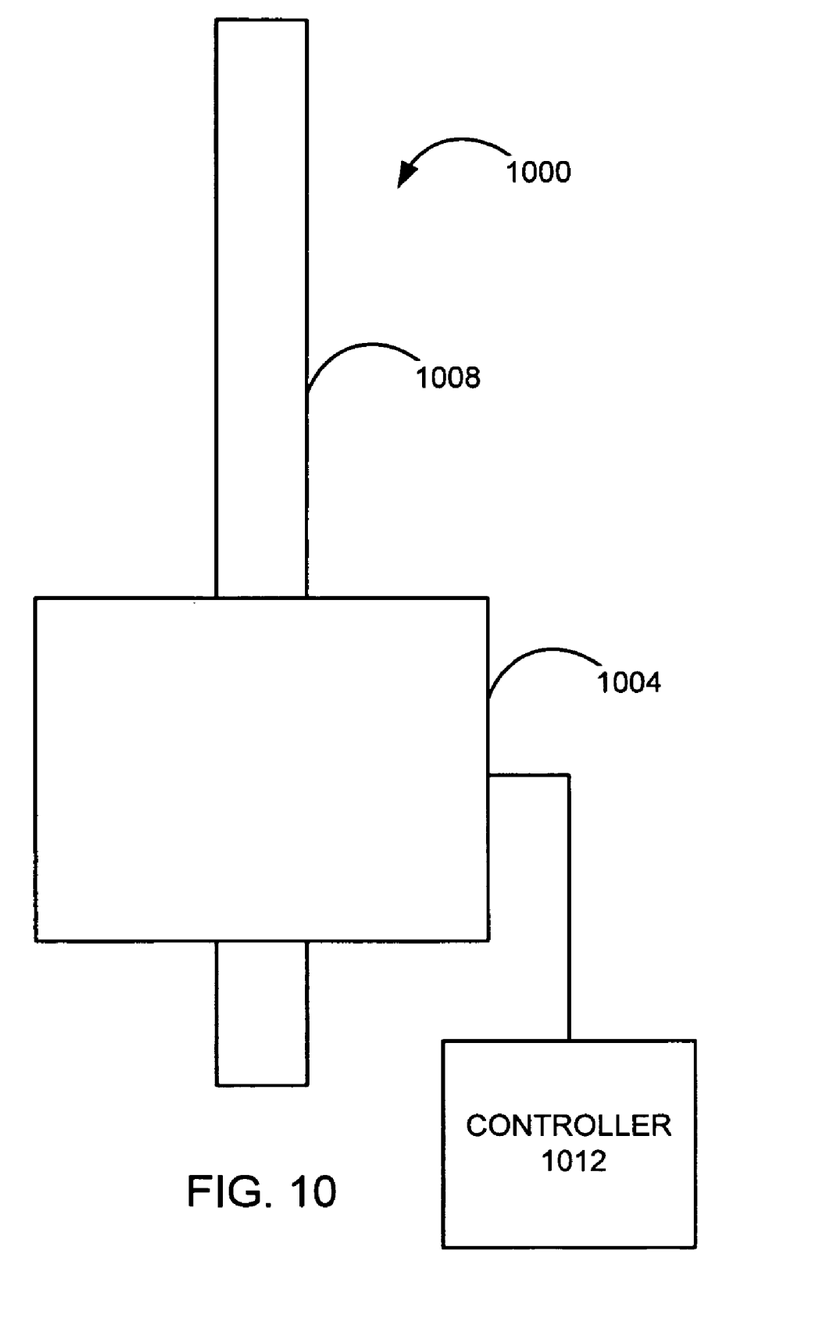
FIG. 10 is a schematic top view of a magnetic resonance imaging (MRI) system.

FIG. 10 is a schematic top view of a magnetic resonance imaging (MRI) system 1000 that may be used in an embodiment of the invention. The MRI system 1000 comprises a magnet system 1004, a patient transport table 1008 connected to the magnet system, and a controller 1012 controllably connected to the magnet system. In one example, a patient would lie on the patient transport table 1008 and the magnet system 1004 would pass around the patient. The controller 1012 would control magnetic fields and radio frequency (RF) signals provided by the magnet system 1004 and would receive signals from detectors in the magnet system 1004. In this example, the magnet system would comprise a plurality of coils for parallel imaging.

Figure 11A:
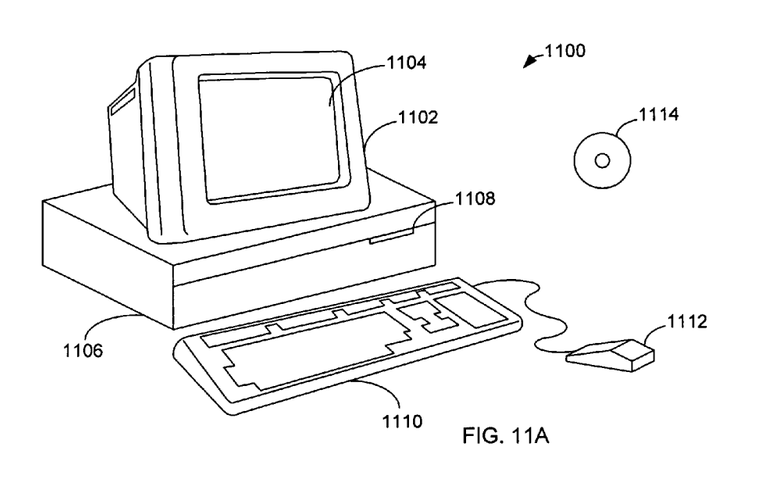
FIGS. 11A-B illustrate a computer system, which is suitable for implementing a controller used in embodiments of the present invention.
Figure 11B:
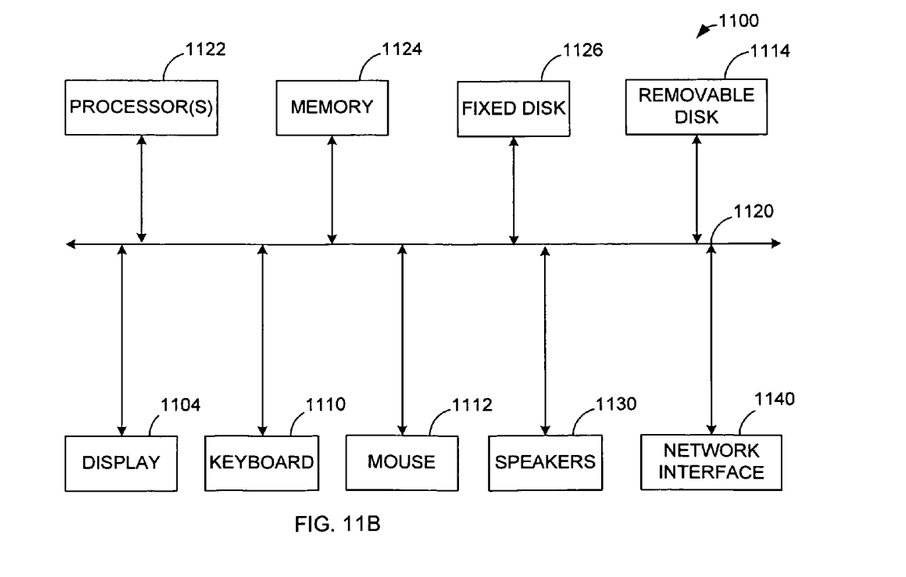

FIGS. 11A and 11B illustrate a computer system 1100, which is suitable for implementing a controller 1012 used in embodiments of the present invention. FIG. 11A shows one possible physical form of the computer system. Of course, the computer system may have many physical forms ranging from an integrated circuit, a printed circuit board, and a small handheld device up to a huge super computer. Computer system 1100 includes a monitor 1102, a display 1104, a housing 1106, a disk drive 1108, a keyboard 1110, and a mouse 1112. Disk 1114 is a computer-readable medium used to transfer data to and from computer system 1100.

FIG. 11B is an example of a block diagram for computer system 1100. Attached to system bus 1120 are a wide variety of subsystems. Processor(s) 1122 (also referred to as central processing units, or CPUs) are coupled to storage devices, including memory 1124. Memory 1124 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable kind of the computer-readable media described below. A fixed disk 1126 is also coupled bi-directionally to CPU 1122; it provides additional data storage capacity and may also include any of the computer-readable media described below. Fixed disk 1126 may be used to store programs, data, and the like and is typically a secondary storage medium (such as a hard disk) that is slower than primary storage. It will be appreciated that the information retained within fixed disk 1126 may, in appropriate cases, be incorporated in standard fashion as virtual memory in memory 1124. Removable disk 1114 may take the form of the computer-readable media described below.

CPU 1122 is also coupled to a variety of input/output devices, such as display 1104, keyboard 1110, mouse 1112, and speakers 1130. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1122 optionally may be coupled to another computer or telecommunications network using network interface 1140. With such a network interface, it is contemplated that the CPU might receive information from the network, or might output information to the network in the course of performing the above-described method steps. Furthermore, method embodiments of the present invention may execute solely upon CPU 1122 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A computer implemented method for designing a spectral-spatial pulse for exciting at least one passband and minimally exciting at least one stopband for execution on a MRI system having a magnet system and a controller for controlling the magnet system and generating a desired pulse sequence, comprising:
   a) generating in the controller a uniform shaped spectral envelope; and
   b) generating in the controller for a plurality of $k_z \neq 0$, $k_z$ dependent weights for a spectral envelope that approximate a $k_z=0$ envelope and provide the at least one passband and the at least one stopband for each of the plurality of $k_z \neq 0$;
   c) generating through the magnetic system a spectral-spatial excitation pulse with the uniform shaped envelope and the plurality of $k_z$ dependent weights.

2. The computer implemented method, as recited in claim 1, wherein the generating $k_z$ dependent weights for a spectral envelope further provides skew correction.

3. The computer implemented method, as recited in claim 2, wherein the at least one passband and one stopband provide a selective excitation of a first species while suppressing a second species.

4. The computer implemented method, as recited in claim 3, wherein the first species is water and the second species is fat.

5. The computer implemented method, as recited in claim 4, wherein the spectral-spatial pulse has a zig-zag trajectory through excitation k-space.

6. The computer implemented method, as recited in claim 5, wherein the generating for a plurality of $k_z \neq 0$, $k_z$ dependent weights comprises applying a weighted least squares formulation to solve for non-uniformly spaced r values with a Fourier transform that most closely matches a desired frequency response H according to an equation $r=(A^\dagger WA)^{-1}A^\dagger WH$, where A is a Fourier matrix modified to include sample delays and W is a diagonal matrix of weights and H is a column vector containing a desired frequency response defined by the at least one passband and one stopband.

7. The computer implemented method, as recited in claim 1, wherein the generating for a plurality of $k_z \neq 0$, $k_z$ dependent weights comprises applying a weighted least squares formulation to solve for non-uniformly spaced r values with a Fourier transform that most closely matches a desired frequency response H according to an equation $r=(A^\dagger WA)^{-1}A^\dagger WH$, where A is a Fourier matrix modified to include sample delays and W is a diagonal matrix of weights and H is a column vector containing a desired frequency response defined by the at least one passband and one stopband.

8. A magnetic resonance imaging (MRI) method for selectively imaging a first species and suppressing a second species in a MRI system having a magnet system and a controller for controlling the magnet system, comprising:
   a) generating in the controller a uniform shaped spectral envelope; and
   b) generating in the controller for a dependent weights for a spectral envelope that approximate a $k_z=0$ envelope and provide the at least one passband and the at least one stopband for each of the plurality of $k_z \neq 0$;
   c) providing a spectral-spatial excitation pulse with the weighted $k_z$ dependent spectral envelope for selectively exciting the first species and suppressing the second species through the magnet system;
   d) acquiring a readout signal through the magnet system; and
   e) generating an image from the readout signal through the controller.

9. The method, as recited in claim 8, further comprising displaying the image from the readout signal through the controller.

10. The method, as recited in claim 9, wherein the providing a spectral-spatial excitation pulse with a weighted $k_z$ dependent spectral envelope, provides an excitation at a $k_z \neq 0$, wherein weighting is provided to the spectral envelope to approximate a $k_z=0$ envelope.

11. The method, as recited in claim 10, wherein subpulses are weighted to provide the spectral-spatial excitation pulse with a weighted $k_z$ dependent spectral envelope.

12. The method, as recited in claim 11, wherein the first species is water and the second species is fat.

13. The method, as recited in claim 8, wherein the generating for a plurality of $k_z \neq 0$, $k_z$ dependent weights comprises applying a weighted least squares formulation to solve for non-uniformly spaced r values with a Fourier transform that most closely matches a desired frequency response H according to an equation $r=(A^\dagger WA)^{-1}A^\dagger WH$, where A is a Fourier matrix modified to include sample delays and W is a diagonal matrix of weights and H is a column vector containing a desired frequency response defined by the at least one passband and one stopband.

14. A magnetic resonance imaging (MRI) method for selectively imaging a first species and suppressing a second species in a MRI system having a magnet system and a controller for controlling the magnet system, comprising:
   a) providing spectral-spatial excitation pulse with a weighted $k_z$ dependent spectral envelope for selectively exciting the first species and suppressing the second species through the magnet system, wherein the providing the spectral-spatial excitation provides a skew correction;

b) acquiring a readout signal through the magnet system; and c) generating an image from the readout signal through the controller.

15. The method, as recited in claim 14, wherein the acquiring the readout uses an echo planar-readout trajectory.

16. The method, as recited in claim 15 wherein the providing spectral-spatial excitation provides a zig-zag trajectory through excitation k-space.

17. The method, as recited in claim 16, wherein the generating for a plurality of $k_z \neq 0$, $k_z$ dependent weights comprises applying a weighted least squares formulation to solve for non-uniformly spaced r values with a Fourier transform that most closely matches a desired frequency response H according to an equation $r=(A^\dagger WA)^{-1}A^\dagger WH$, where A is a Fourier matrix modified to include sample delays and W is a diagonal matrix of weights and H is a column vector containing a desired frequency response defined by the at least one passband and one stopband.

18. An apparatus for providing magnetic resonance imaging by selectively exciting a first species and suppressing a second species, comprising:
   a magnetic resonance imaging excitation and detection system; and
   a controller electrically connected to the magnetic resonance imaging excitation and detection system, comprising:
      a display;
      at least one processor; and
      computer readable media, comprising:
         computer readable code for providing a spectral-spatial excitation pulse with a weighted $k_z$ dependent spectral envelope for selectively exciting the first species and suppressing the second species, wherein the providing the spectral-spatial excitation provides a skew correction;
         computer readable code for acquiring a readout signal;
         computer readable code for generating an image from the readout signal; and
         computer readable code for displaying the image from the readout signal on the display.

19. An apparatus, as recited in claim 18, wherein the computer readable media further comprises:
   computer readable code for generating a uniform shaped spectral envelope; and
   computer readable code for generating for a plurality of $k_z \neq 0$, $k_z$ dependent weights for a spectral envelope that approximate a $k_z=0$ envelope and provide the at least one passband and the at least one stopband for each of the plurality of $k_z \neq 0$.

* * * * *